(12) United States Patent
Chen et al.

(10) Patent No.: US 12,369,272 B2
(45) Date of Patent: Jul. 22, 2025

(54) IMMERSION COOLING SYSTEM WITH AIRTIGHT LINK LATCH COVER STRUCTURE

(71) Applicant: Delta Electronics, Inc., Taoyuan (TW)

(72) Inventors: Chia-Hsing Chen, Taoyuan (TW);
Chen-Hsiu Lee, Taoyuan (TW);
Hsuan-Ting Liu, Taoyuan (TW);
Chiu-Chin Chang, Taoyuan (TW);
Kuan-Lung Wu, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 213 days.

(21) Appl. No.: 18/227,194

(22) Filed: Jul. 27, 2023

(65) Prior Publication Data
US 2024/0422942 A1 Dec. 19, 2024

(30) Foreign Application Priority Data
Jun. 15, 2023 (TW) ................................ 112122292

(51) Int. Cl.
*H05K 7/20* (2006.01)
*H05K 5/02* (2006.01)
*H05K 5/03* (2006.01)

(52) U.S. Cl.
CPC .......... *H05K 7/203* (2013.01); *H05K 5/0221* (2013.01); *H05K 5/03* (2013.01)

(58) Field of Classification Search
CPC ......... H05K 7/203; H05K 5/0221; H05K 5/03
USPC ........................................................ 361/700
See application file for complete search history.

(56) References Cited

U.S. PATENT DOCUMENTS

| 1,118,435 | A | * | 11/1914 | Mosler et al. | ............ E05G 1/00 220/248 |
| 1,808,403 | A | * | 6/1931 | Eklund | ................... F16J 13/08 292/48 |
| 4,005,341 | A | * | 1/1977 | Uptegraff, Jr. | .......... H01F 27/02 361/37 |
| 4,467,936 | A | | 8/1984 | Makhijani | |

(Continued)

FOREIGN PATENT DOCUMENTS

| CN | 105804539 A | 7/2016 |
| CN | 210085655 U | 2/2020 |

(Continued)

*Primary Examiner* — Anatoly Vortman
(74) *Attorney, Agent, or Firm* — KIRTON McCONKIE; Evan R. Witt (57) ABSTRACT

An immersion cooling system is provided. The immersion cooling system includes a box, an upper cover, plural fixing components, plural latches and a link module. The box has an opening upwardly. The upper cover covers the opening. The fixing components are disposed on the box and arranged adjacent to the outer perimeter of the opening. The latches corresponding to the fixing components are disposed on the upper cover. The link module includes plural crossbars corresponding to the latches. The link module moves downwardly close to the upper cover, scroll-wheels of the latches roll along limiting surfaces of corresponding fixing components and press against the upper cover, the upper cover closes the opening to form an airtight space. The link module moves upwardly away from the upper cover, the scroll-wheels are separated away from the limiting surfaces of corresponding fixing components, allows the upper cover to separate from the opening.

20 Claims, 10 Drawing Sheets

(56) References Cited

U.S. PATENT DOCUMENTS

| | | | |
|---|---|---|---|
| D663,134 S * | 7/2012 | Wu | D6/708 |
| 9,049,800 B2 * | 6/2015 | Shelnutt | H05K 7/20318 |
| 9,328,964 B2 * | 5/2016 | Shelnutt | H05K 7/20318 |
| 9,801,302 B2 * | 10/2017 | Huang | H05K 7/186 |
| 10,737,847 B1 * | 8/2020 | Liu | B65D 43/06 |
| 11,375,638 B2 * | 6/2022 | Cheng | H05K 7/20818 |
| 11,706,901 B2 * | 7/2023 | Wu | H05K 7/20781 |
| | | | 361/699 |
| 11,772,858 B2 * | 10/2023 | Chen | B65D 81/18 |
| | | | 220/592.02 |
| 11,905,747 B2 * | 2/2024 | Huang | F16H 21/16 |
| 12,004,328 B2 * | 6/2024 | Peterson | H05K 7/20809 |
| 2015/0144206 A1 | 5/2015 | Dickinson et al. | |
| 2018/0238078 A1 * | 8/2018 | Huang | E05B 17/147 |
| 2020/0113082 A1 * | 4/2020 | Yang | H05K 7/20909 |
| 2020/0337176 A1 | 10/2020 | Aoki et al. | |
| 2022/0065010 A1 * | 3/2022 | Huang | E05D 3/02 |
| 2023/0087146 A1 | 3/2023 | Cheng et al. | |
| 2023/0158317 A1 * | 5/2023 | Hsieh | G02B 6/4254 |
| | | | 174/650 |

FOREIGN PATENT DOCUMENTS

| | | | | |
|---|---|---|---|---|
| CN | 112683460 A | | 4/2021 | |
| CN | 213368392 U | | 6/2021 | |
| CN | 114945260 A | | 8/2022 | |
| CN | 115551298 A | | 12/2022 | |
| DE | 1958729 U | | 4/1967 | |
| JP | H02214147 A | | 8/1990 | |
| TW | 202208754 A | * | 3/2022 | A61N 1/3754 |
| TW | I772092 B | | 7/2022 | |

* cited by examiner

IMMERSION COOLING SYSTEM WITH AIRTIGHT LINK LATCH COVER STRUCTURE

CROSS-REFERENCE TO RELATED APPLICATION

This application claims priority to Taiwan Patent Application No. 112122292, filed on Jun. 15, 2023. The entire contents of the above-mentioned patent application are incorporated herein by reference for all purposes.

FIELD OF THE INVENTION

The present disclosure relates to an immersion cooling system, and more particularly to an immersion cooling system with an airtight link latch cover structure having handles combined with a link module to synchronously drive a plurality of latches in an open operation or a close operation, so that the convenience of operation is increased, and the airtight effect is achieved when the upper cover is locked.

BACKGROUND OF THE INVENTION

A dual-phase immersion cooling system is to immerse a heat-generating electronic components directly in a dielectric liquid. The latent heat phase change of the dielectric served as the working liquid is utilized to dissipate the heat during heating and boiling vaporization. In order to avoid the escape of the dielectric liquid after vaporization, the container used in the system must be airtight. Furthermore, the container should also allow the user to replace the electronic components.

Usually, the air-tightness of the conventional immersion cooling system is realized through screw locking. Although it has a good sealing effect, it is inconvenient to operate and the man-hours for maintenance will be increased. In addition, the hasp design is also commonly used in the air-tightness of the immersion cooling system. It is easy to operate, but there must be enough space on the outside for operating and performing the opening or closing action stroke.

Therefore, there is a need of providing an immersion cooling system with an airtight link latch cover structure having handles combined with a link module to synchronously drive a plurality of latches in an open operation or a close operation, so as to increase the convenience of operation, achieve the airtight effect when the upper cover is locked, and obviate the drawbacks encountered by the prior arts.

SUMMARY OF THE INVENTION

An object of the present disclosure is to provide an immersion cooling system with an airtight link latch cover structure having handles combined with a link module to synchronously drive a plurality of latches in an open operation or a close operation, so that the convenience of operation is increased, and the airtight effect is achieved when the upper cover is locked. Consequently, the leakage of evaporated gas is avoided, the loss of dielectric liquid is decreased, and the purpose of cost saving is achieved.

Another object of the present disclosure is to provide an immersion cooling system with an airtight link latch cover structure. The airtight link latch cover structure is disposed over an upper space of the immersion cooling system by combining a link module with a plurality of latches. The plurality of latches disposed on the upper cover are arranged adjacent to the at least three fastening lateral sides of the upper cover, and spatially corresponding to a plurality of fixing components disposed adjacent to an outer perimeter of the opening of the box, so that the plurality of latches are cooperated with the plurality of fixing components in pairs. The link module allows to synchronously drive each handle of the latches disposed adjacent to the different fastening lateral sides of the same fastening lateral side through the link elements, and the user only needs to perform the operations of sealing, unlocking and opening the upper cover in the space above the upper cover. When the user presses down the link module to synchronously drive the plurality of handles of the plurality of latches, only the scroll-wheels pivotally connected to the front ends of the sliding rods of the plurality of latches exceed the vertical projection range of the upper cover and interfere with the corresponding ones of the plurality of fixing components. In detail, when the scroll-wheels are driven by the sliding rods to move towards the corresponding ones of the fixing components, each scroll-wheel rolling along the corresponding limiting surface of the fixing components is pressed against the corresponding limiting surface to push the upper cover downwardly, so that the plurality of latches are pushed downwardly at the same time, and the sealing strip between the upper cover and the box is compressed to achieve the effect of sealing the opening. Consequently, it completely prevents the dielectric liquid in the box from evaporating and leaking through the opening, the loss of the dielectric liquid is decreased, and the purpose of cost saving is achieved. On the other hand, when the user pulls up the link module to synchronously drive the plurality of handles of the plurality of latches, each scroll-wheel of the plurality of latches rolls back into the respective housing base along the direction away from the corresponding limiting surface, and does not interfere with the corresponding fixing component. The link module and the plurality of latches are all within the vertical projection range of the upper cover, and it allows the upper cover to be separated from the opening of the box for the user to perform the maintenance work or replace electronic components in the box. The opening and closing operations are simplified effectively, and the convenience of operation is improved. In addition, the plurality of latches and the plurality of fixing components cooperated in pairs are not limited to being disposed adjacent to the three fastening lateral sides of the upper cover. The hinge connection between the connecting side of the upper cover and the box can also be replaced by the latching method of the latch and the fixing component in pair, so that the operation of unlocking and opening the upper cover can be realized in a single direction (up or down). In other words, when the upper cover seals the opening of the box in the immersion cooling system through the airtight link latch cover structure, the number and the arrangement of the plurality of latches are adjustable according to the airtight requirements, so as to increase the convenience of operation and maintain the airtight effect when the upper cover is locked. Consequently, the leakage of evaporated gas is avoided, the loss of dielectric liquid is decreased, and the purpose of cost saving is achieved.

In accordance with an aspect of the present disclosure, an immersion cooling system with an airtight link latch cover structure is provided and includes a box, an upper cover, a plurality of fixing components, a plurality of latches and a link module. The box includes an opening facing upwards. The upper cover includes a connection lateral side, three fastening lateral sides, a top surface and a bottom surface, wherein the connection lateral side and the three fastening lateral sides are connected between the top surface and the bottom surface, the connection lateral side is connected to an edge of the opening, and the bottom surface covers the opening to form an airtight space. The plurality of fixing components are spatially corresponding to the three fastening lateral sides and disposed adjacent to an outer perimeter of the opening, wherein each of the plurality of fixing components includes a limiting surface, and the limiting surfaces have a height greater than that of the top surface when the bottom surface covers the opening. The plurality of latches are spatially corresponding to the plurality of fixing components and disposed on the top surface of the upper cover. Each of the plurality of latches includes a housing base, a sliding rod, a scroll-wheel and a handle. The housing base is disposed on the upper cover, faces a corresponding one of the plurality of fixing components, and is arranged adjacent to one of the three fastening lateral sides. The sliding rod is slidably disposed on the housing base, wherein a front end of the sliding rod faces the corresponding one of the plurality of fixing components. The scroll-wheel is pivotally connected to the front end of the sliding rod. The handle is pivotally connected to the housing base and includes an end abutting against the sliding rod, wherein another end of the handle is operated to drive the sliding rod to slide in a horizontal direction. The link module is spatially arranged above the top surface of the upper cover, and includes a plurality of crossbars corresponding to the plurality of handles of the plurality of latches, wherein the plurality of handles include a plurality of connection ends slidably connected to corresponding ones of the plurality of crossbars, respectively. When the link module is moved down toward the top surface of the upper cover, the plurality of crossbars drive the plurality of handles to simultaneously drive the plurality of sliding rods to slide horizontally toward the corresponding plurality of fixing components, and the plurality of scroll-wheels roll along and abut against the limiting surfaces of the plurality of fixing components corresponding thereto, so that the bottom surface of the upper cover closely fits the opening to form the airtight space. When the link module is moved up away from the top surface of the upper cover, the plurality of crossbars drive the plurality of handles to simultaneously drive the plurality of sliding rods to slide horizontally away from the corresponding plurality of fixing components, and the plurality of scroll-wheels move away from the limiting surfaces of the plurality of fixing components corresponding thereto, so that the bottom surface of the upper cover allows being separated from the opening.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "upper," "lower," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments.

Figure 1:
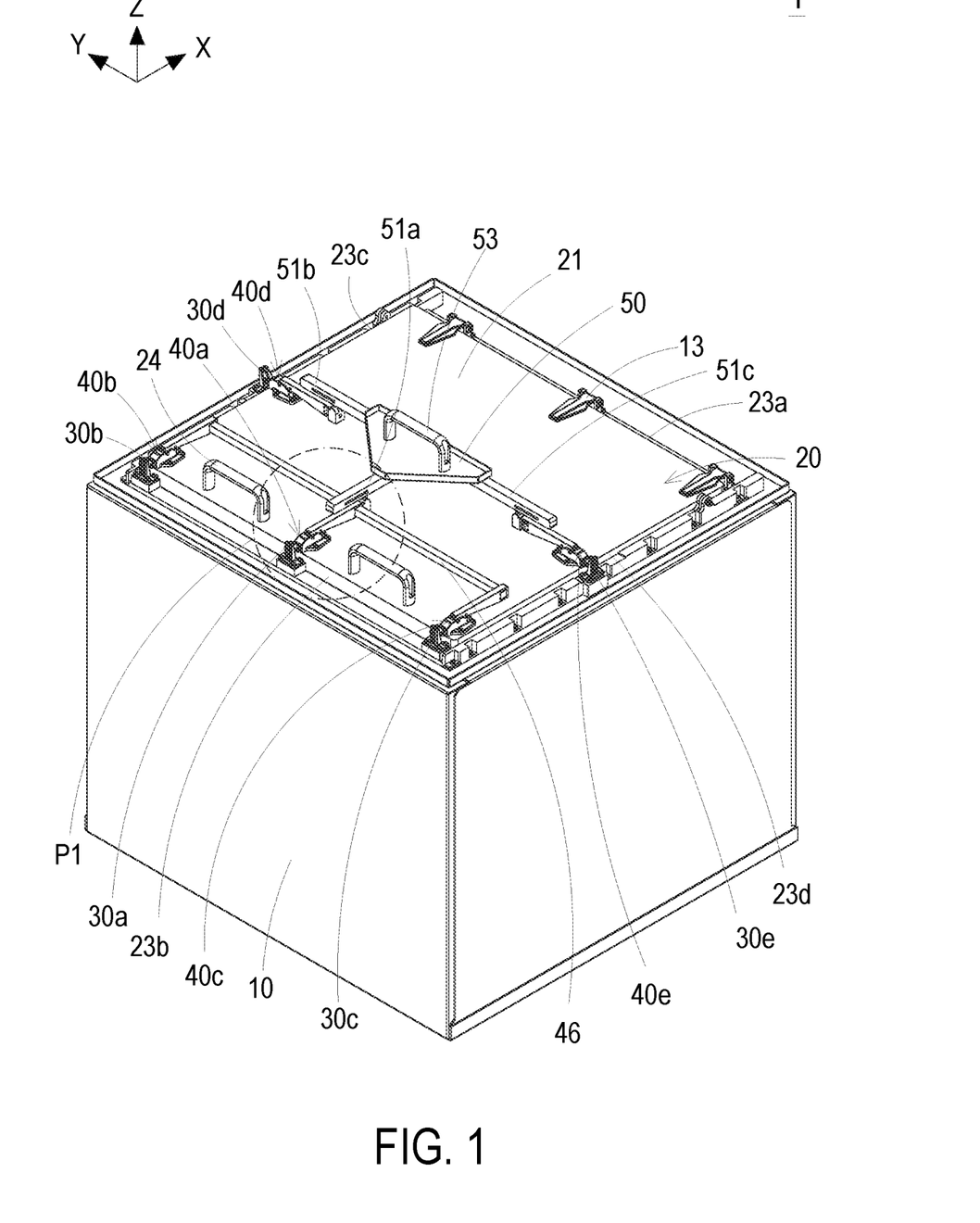
FIG. 1 is a perspective structural view illustrating an immersion cooling system with an airtight link latch cover structure operated in the closed state according to a first embodiment of the present disclosure.
Figure 2:
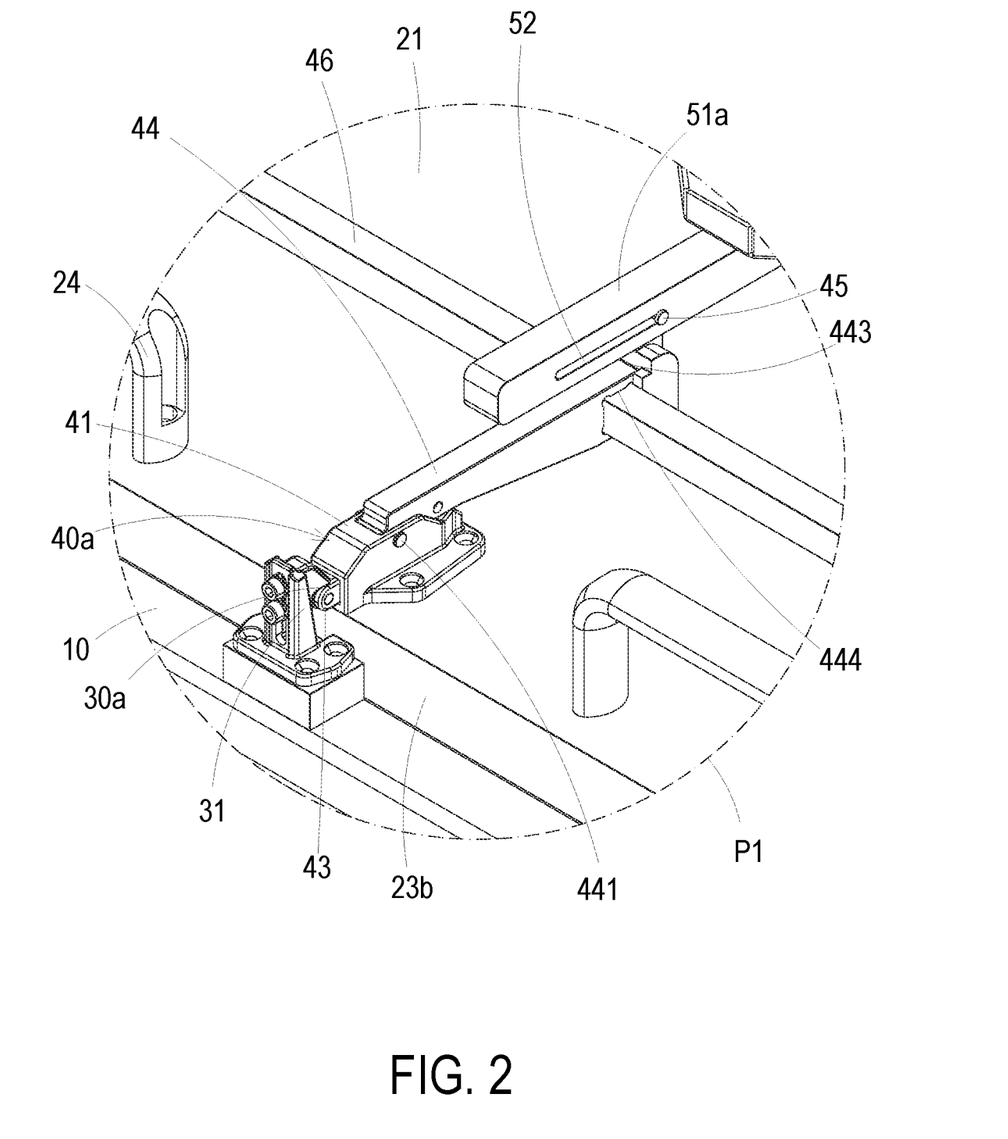
FIG. 2 is an enlarged view of the region P1 in FIG. 1.
Figure 3:
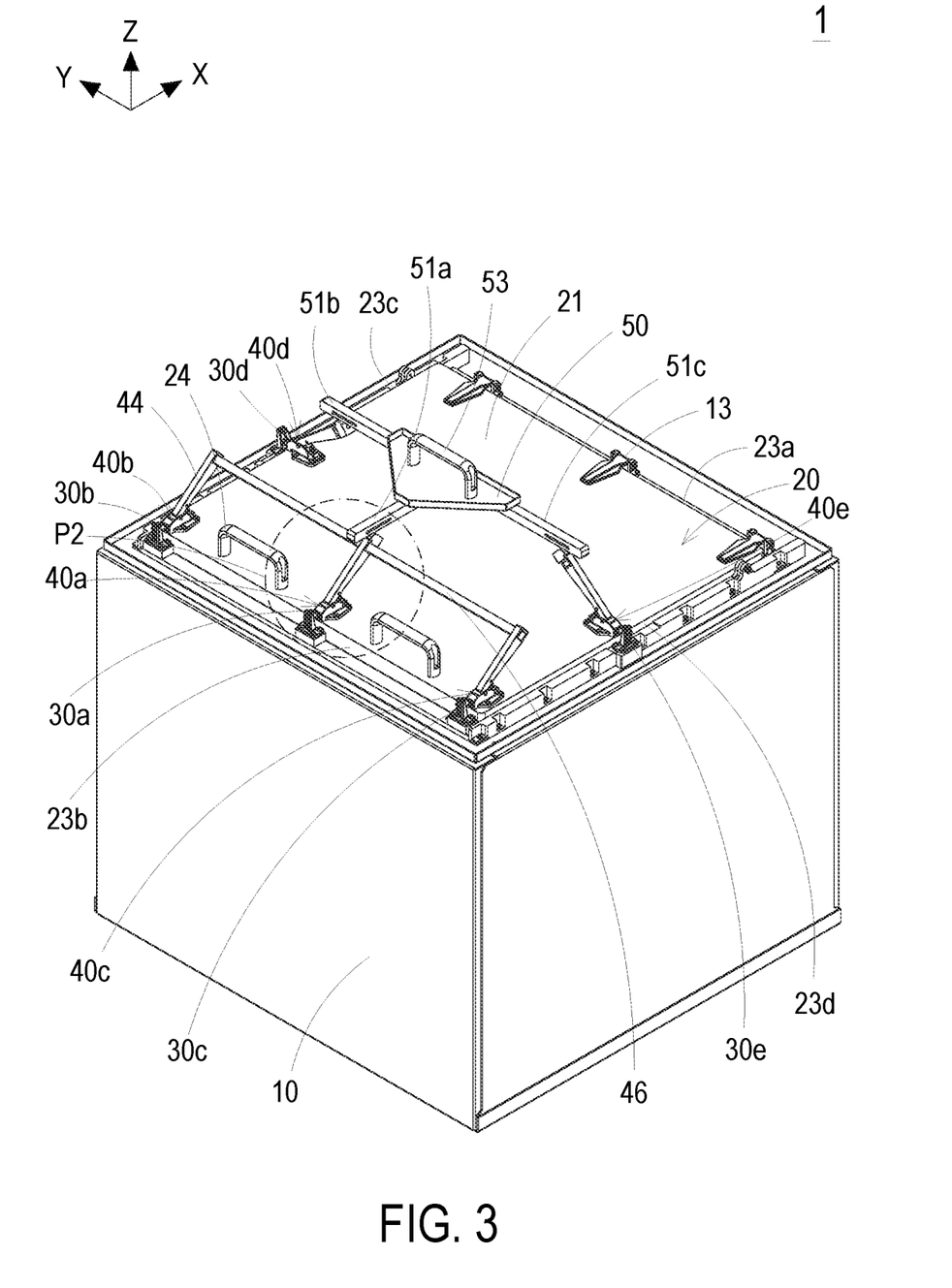
FIG. 3 is a perspective structural view illustrating the immersion cooling system with the airtight link latch cover structure operated in the unlocked state according to the first embodiment of the present disclosure.
Figure 4:
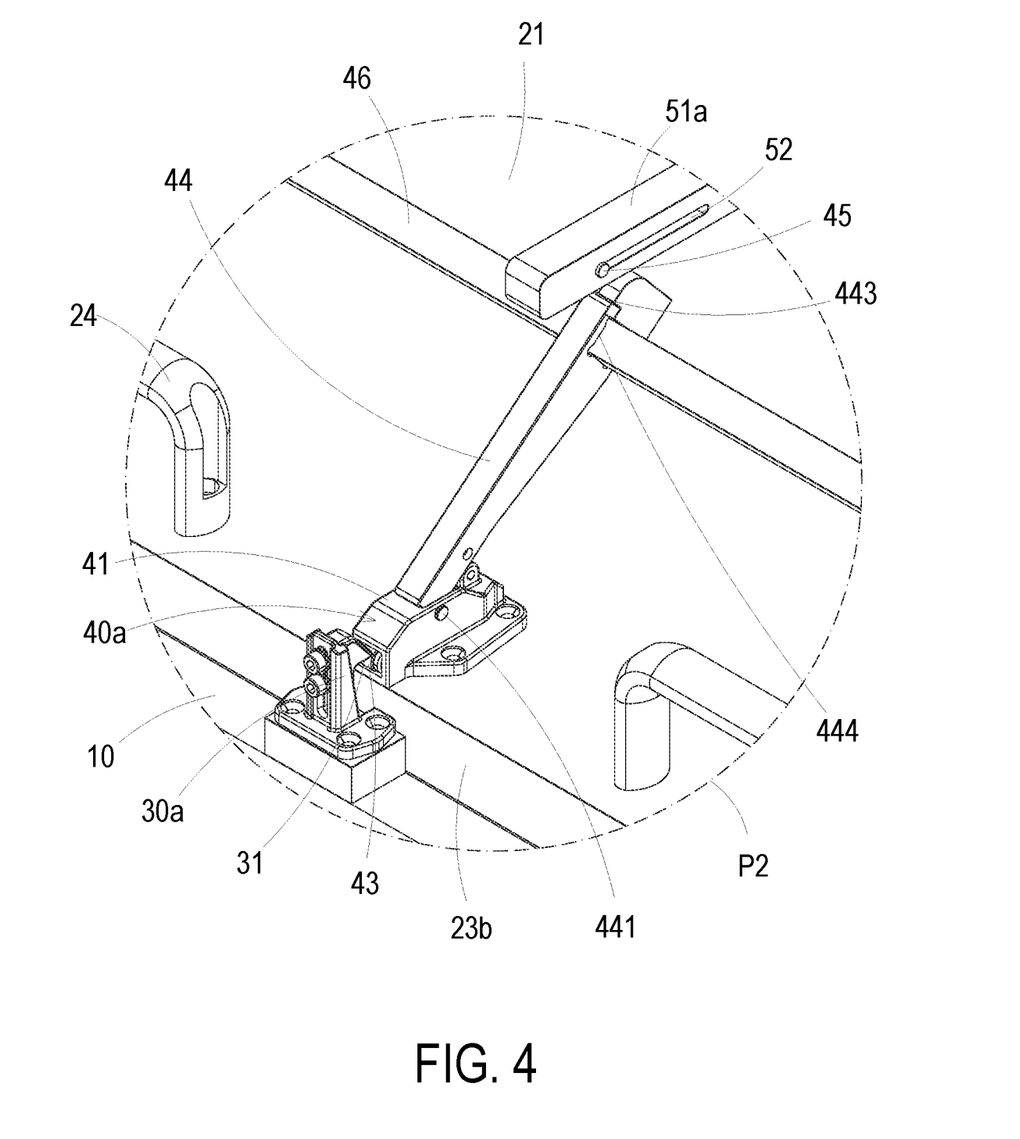
FIG. 4 is an enlarged view of the region P2 in FIG. 3.
Figure 5:
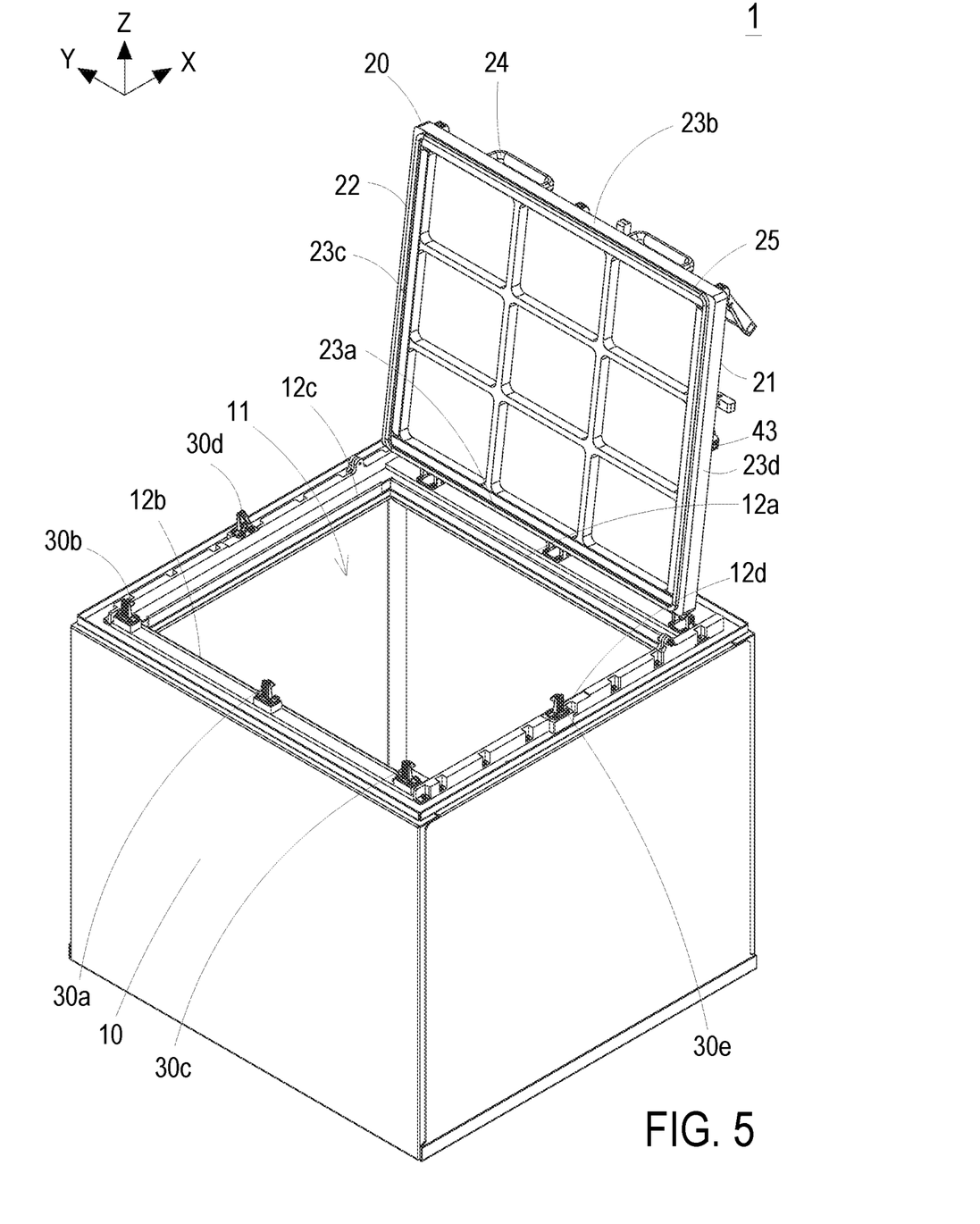
FIG. 5 is a perspective structural view illustrating the immersion cooling system with the airtight link latch cover structure operated in the opening state of the upper cover according to the first embodiment of the present disclosure.
Figure 6:
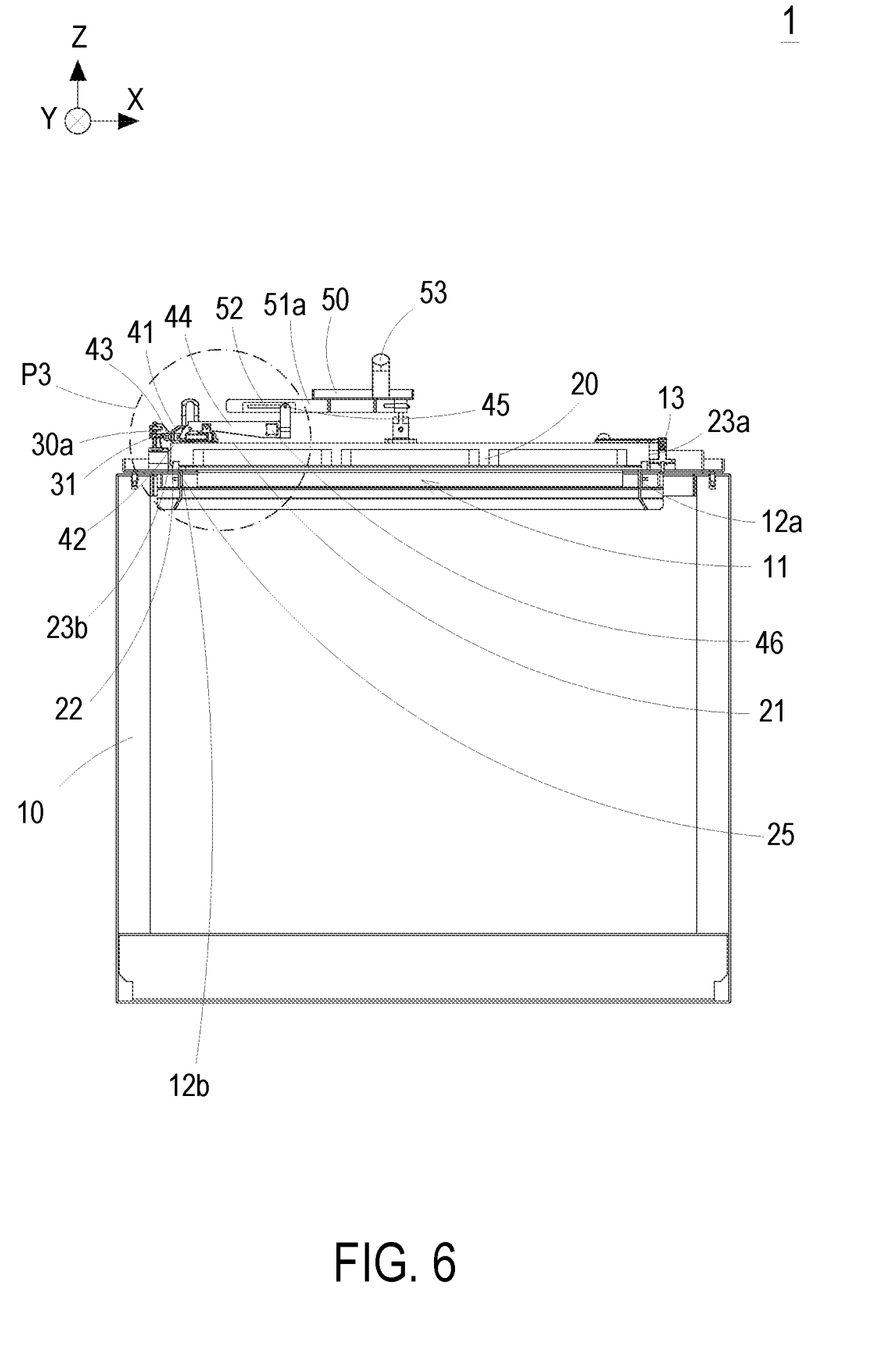
FIG. 6 is a perspective structural view illustrating the immersion cooling system with the airtight link latch cover structure operated in the closed state according to the first embodiment of the present disclosure.
Figure 7:
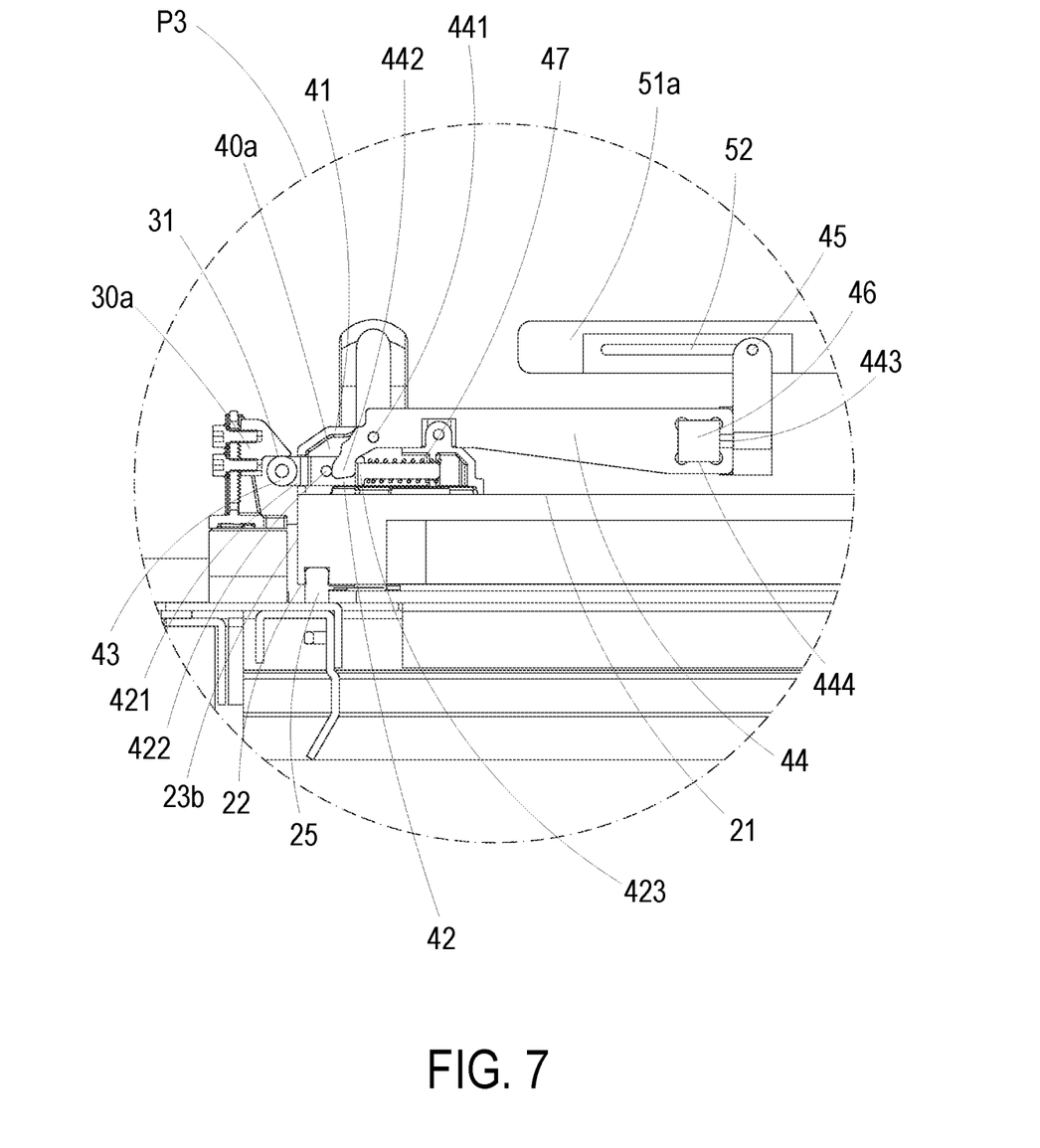
FIG. 7 is an enlarged view of the region P3 in FIG. 6.
Figure 8:
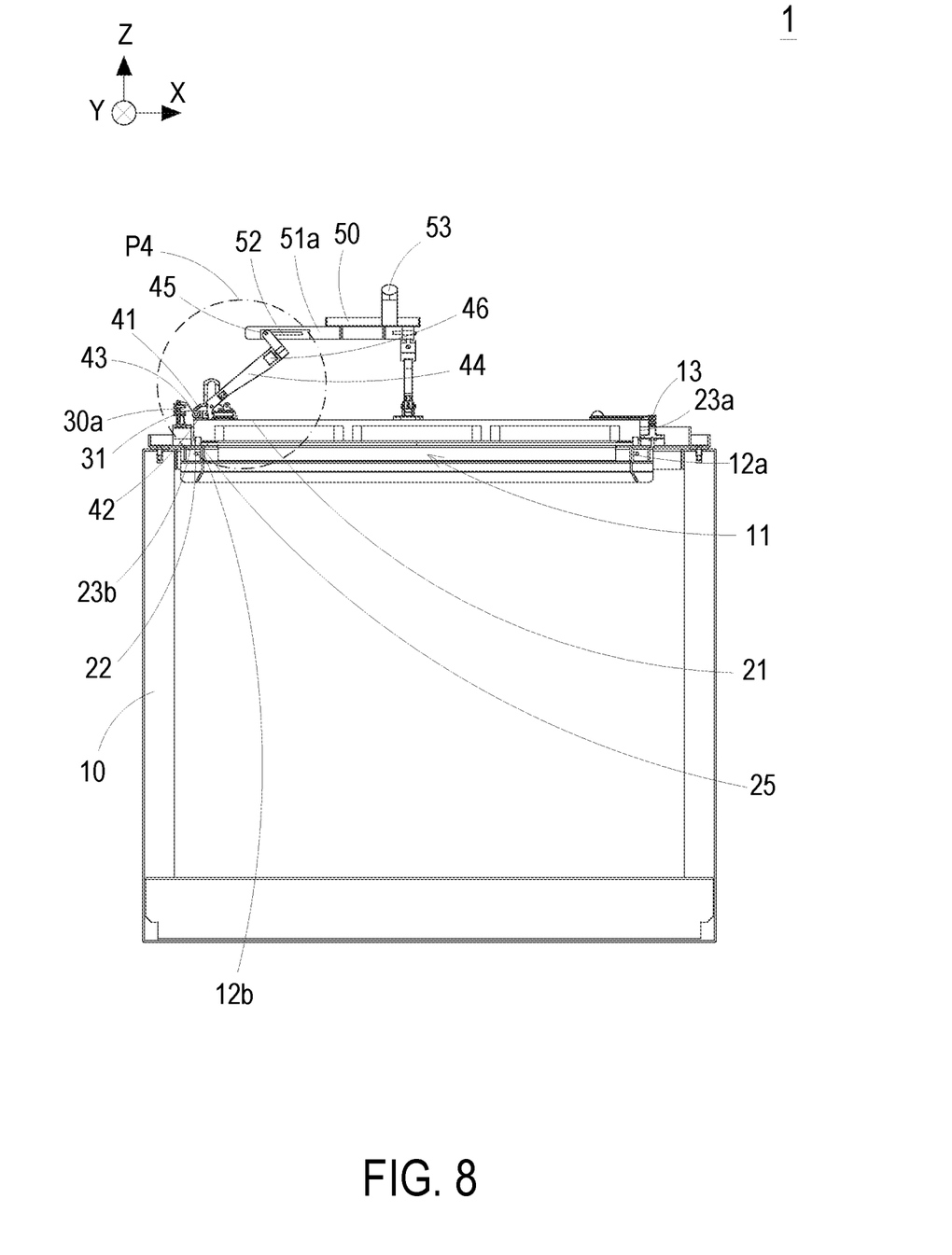
FIG. 8 is a cross sectional view illustrating the immersion cooling system with the airtight link latch cover structure operated in the unlocked state according to the first embodiment of the present disclosure.
Figure 9:
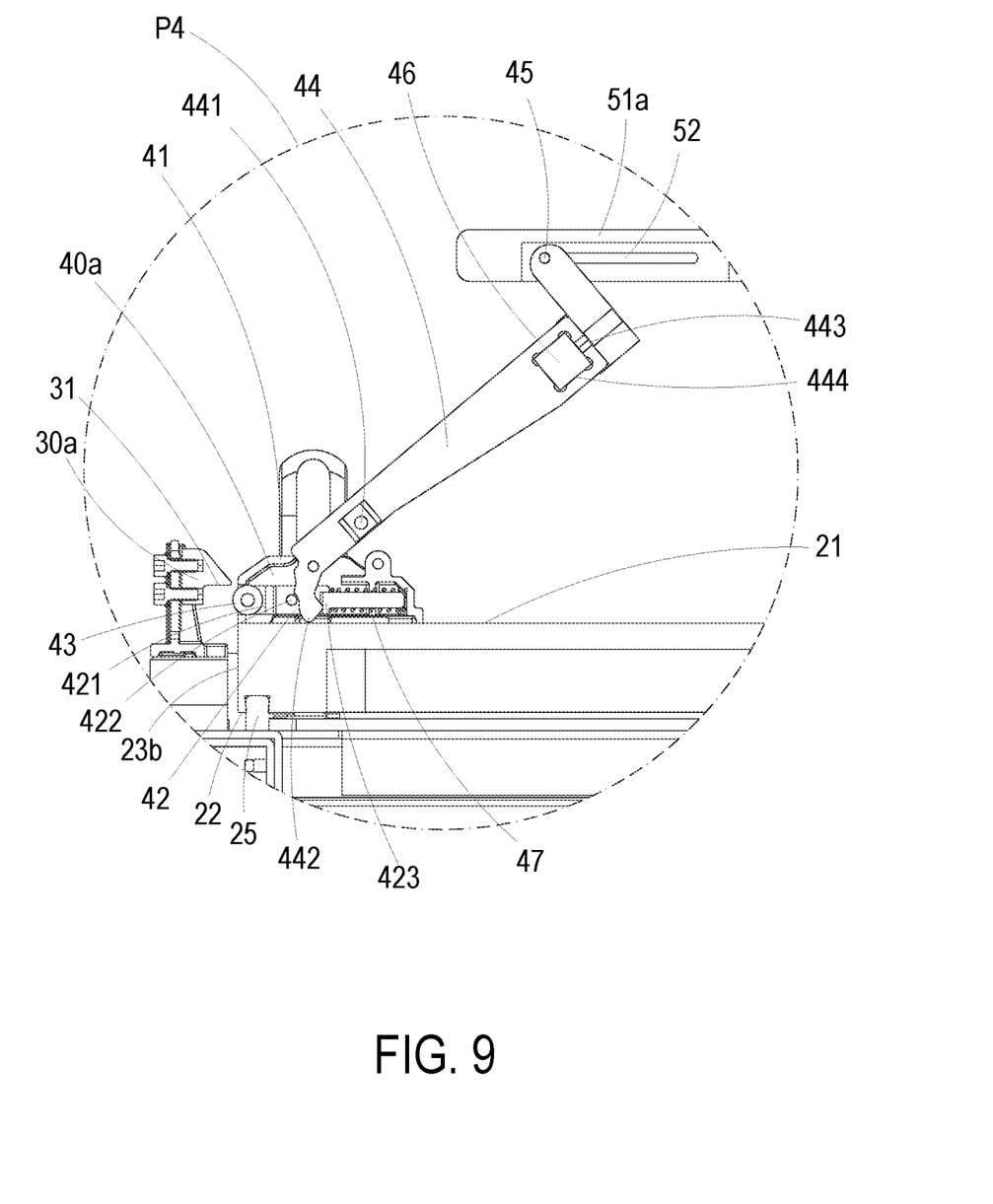
FIG. 9 is an enlarged view of the region P4 in FIG. 7.

Please refer to FIG. 1 to FIG. 9. An immersion cooling system with an airtight link latch cover structure is illustrated according to a first embodiment of the present disclosure. In the embodiment, the immersion cooling system 1 with an airtight link latch cover structure is provided and includes a box 10, an upper cover 20, a plurality of fixing components 30a-30e, a plurality of latches 40a-40e and a link module 50. Preferably but not exclusively, the immersion cooling system 1 is applied to the cooling of electronic components. The box 10 includes an opening 11. The dielectric liquid for cooling and the electronic components (not shown) required to be cooled are contained in the interior of the box 10. Preferably but not exclusively, the opening 11 of the box 10 faces upwards, for example, toward the Z axial direction for users to perform the replacement or maintenance operations. When the immersion cooling system 1 performs the cooling operation, the opening 11 needs to be closed. In the embodiment, the upper cover 20 includes a connection lateral side 23a, three fastening lateral sides 23b-23d, a top surface 21 and a bottom surface 22. The connection lateral side 23a and the three fastening lateral sides 23b-23d are connected between the top surface 21 and the bottom surface 22 to form a rectangle. In the embodiment, the connection lateral side 23a of the upper cover 20 is connected to an edge 12a of the opening 11 through three pivot elements 13. Moreover, the three fastening lateral sides 23b-23d of the upper cover 20 are fastened to the other three edges 12b-12d of the opening 11 through the plurality of latches 40a-40e and the plurality of fixing components 30a-30e cooperated in pairs, so that the bottom surface 22 of the upper cover 20 covers the opening 11 to form an airtight space in the box 10. Certainly, the connection between the connection lateral side 23a of the upper cover 20 and the edge 12a of the opening 11 is not limited to the pivot connection or the hasp connection. In the embodiment, the plurality of fixing components 30a-30e are disposed on the upper cover 20 and disposed adjacent to an outer perimeter of the opening 11. Furthermore, the plurality of fixing components 30a-30e are spatially corresponding to the three fastening lateral sides 23b-23d of the upper cover 20. In the embodiment, each of the plurality of fixing components 30a-30e includes a limiting surface 31. Moreover, when the bottom surface 22 of the upper cover 20 covers the opening 11, the limiting surfaces 31 of the fixing components 30a-30e have a height in the Z axial direction greater than a height of the top surface 21 in the Z axial direction (Referring to FIG. 7). It should be noted that the plurality of limiting surfaces 31 of the plurality of fixing components 30a-30e are fixed, for example, by the adjusting screws, and the height of the limiting surfaces 31 in the Z axial direction is adjustable according to the practical requirements, and the present disclosure is not limited thereto. In the embodiment, the plurality of latches 40a-40e are spatially corresponding to the plurality of fixing components 30a-30e and disposed on the top surface 21 of the upper cover 20. The link module 50 is spatially arranged above the top surface 21 of the upper cover 20, and includes a plurality of crossbars 51a-51c corresponding to the plurality of latches 40a-40e. Preferably but not exclusively, the plurality of crossbars 51a-51c are movably connected to the plurality of latches 40a-40e. When the link module 50 is operated to attach to the top surface 21 of the upper cover 20 and move downwards (along the Z axial direction), the plurality of latches 40a-40e interfere with the corresponding ones of the plurality of fixing components 30a-30e, so that the bottom surface 22 of the upper cover 20 closely fits the opening 11 to form the airtight space. On the contrary, when the link module 50 is operated to move up away from the top surface 21 of the upper cover 20, the plurality of latches 40a-40e and the corresponding plurality of fixing components 30a-30e do not interfere with each other, and the upper cover 20 can be disengaged from the opening 11. It facilitates the user to replace or maintain the electronic components or the coolant in the box 10, as shown in FIG. 5.

Notably, in the embodiment, the plurality of latches 40a-40e and the plurality of fixing components 30a-30e are cooperated in pairs. For ease of description, the actuation relationship between the plurality of latches 40a-40e and the plurality of fixing components 30a-30e is only represented by the actuation relationship between the latch 40a and the fixing component 30a in some figures, but the present disclosure is not limited thereto. In the embodiment, each of the plurality of latches 40a-40e includes a housing base 41, a sliding rod 42, a scroll-wheel 43 and a handle 44. The housing base 41 is disposed on the upper cover 20, faces a corresponding one of the plurality of fixing components 30a-30e, and is arranged adjacent to one of the three fastening lateral sides 23b-23d. For example, the housing base 41 of the latch 40a is corresponding to the fixing component 30a, and disposed adjacent to the middle section of the opposite fastening lateral side 23b, and away from the connection lateral side 23a. In the embodiment, the sliding rod 42 is slidably disposed on the housing base 41. When the link module 50 is operated to attach to the top surface 21 of the upper cover 20, the sliding rod 42 can be driven to slide horizontally on the XY plane. For example, one moves along the X axial direction or along the Y axial direction. It depends on the location. In the embodiment, a front end 421 of the sliding rod 42 faces the corresponding one of the plurality of fixing components 30a-30e. For example, the front end 421 of the sliding rod 42 of the latch 40a faces the corresponding fixing component 30a. In the embodiment, the scroll-wheel 43 is pivotally connected to the front end 421 of the sliding rod 42, and spatially corresponding to the limiting surface 31 of the corresponding one of the plurality of fixing components 30a-30e. In the embodiment, the handle 44 is pivotally connected to the housing base 41 and includes an end abutting against the sliding rod 42. When another end of the handle 44 is operated to drive the sliding rod 42, the corresponding sliding rod 42 is driven to slide in a horizontal direction on the XY plane. For example, one moves along the X axial direction or along the Y axial direction. It depends on the location.

For each of the plurality of latches 40a-40e, taking the latch 40a as an example, the sliding rod 42 further includes a first abutting element 422 and a second abutting element 423 accommodated within the housing base 41. The first abutting element 422 is located between the front end 421 and the second abutting element 423. In addition, the handle 44 is pivotally arranged on the housing base 41 through a pivot shaft 441, and the handle 44 further includes an acting end 442 and a connection end 443. The acting end 442 is accommodated with in the housing base 41. Moreover, the acting end 442 is located between the first abutting element 422 and the second abutting element 423, and the connection end 443 is located outside the housing base 41. In the embodiment, the connection end 443 of the handle 44 is slidably connected to an oval slot 52 of the corresponding crossbar 51a through a link element 45. Preferably but not exclusively, when the handle 44 is operated to move down and abut against the first abutting element 422, the front end 421 of the sliding rod 42 to protrude out of the housing base 41 on the XY plane. Preferably but not exclusively, when the handle 44 is operated to move up and abut against the second abutting element 423, the front end 421 of the sliding rod 42 is driven to slide back into the housing base 41 on the XY plane. Preferably but not exclusively, in the embodiment, the first abutting element 422 is a transverse cylinder perpendicular to the acting end 442 of the handle 44. Moreover, the acting end 442 of the handle 44 further includes an arc surface correspondingly abutting against the transverse cylinder on the first abutting element 422. If facilitates the front end 421 of the sliding rod 42 to be pushed out of the housing base 41 smoothly on the XY plane when the operating handle 44 is operated to rotate downward. In addition, a spring 47 is further sleeved on the sliding rod 42. Preferably but not exclusively, the spring 47 is arranged between the second abutting element 423 of the sliding rod 42 and the housing base 41 corresponding thereto. It facilitates the acting end 442 of the handle 44 to push the sliding rod 42 with the elastic force of the spring 47. Certainly, the manner in which the handle 44 is operated to rotate and drive the sliding rod 42 to make the sliding rod 42 slide horizontally is adjustable according to the practical requirements. The present disclosure is not limited thereto.

In the embodiment, the link module 50 is spatially arranged above the top surface 21 of the upper cover 20, and includes a plurality of crossbars 51a-51c corresponding to the plurality of handles 44 of the plurality of latches 40a-40e. Preferably but not exclusively, in the embodiment, the link module 50 includes three crossbars 51a-51c, which are spatially corresponding to the middle sections of the three fastening lateral sides 23b-23d. Therefore, the three crossbars 51a-51c are arranged in a T shape. In the embodiment, at least three of the plurality of latches 40a-40e, such as the latch 40a, the latch 40d and the latch 40e, are disposed adjacent to three middle sections of the three fastening lateral sides 23b-23d, respectively. Moreover, the plurality connection ends 442 of the handles 44 of the latches 40a, 40d, 40e are slidably connected to oval slots 52 of the corresponding crossbars 51a-51c through a link element 45, respectively. In this way, the plurality of handles 44 of the latches 40a, 40d, 40e can be synchronously driven by the link module 50 in one operation.

In addition, the plurality of fixing components 30a-30e and the plurality of latches 40a-40e cooperated in pairs have at least one pair, for example the pair of the fixing component 30a and the latch 40a, disposed adjacent to the middle section of the opposite fastening lateral side 23b, and have at least two others pairs, for example the pair of the fixing component 30b and the latch 40b and the pair of the fixing component 30c and the latch 40c, disposed adjacent to two ends of the opposite fastening lateral side 23b, respectively. That is, at least three pairs of fixing components 30a-30c and the latches 40a-40c are disposed adjacent to the opposite fastening lateral side 23b. In the embodiment, each of the plurality of handles 44 of the plurality of latches 40a-40e has a communication opening 444 disposed adjacent to the connection end 443 of the respective handle 44. Since the latches 40a-40c are arranged along the opposite fastening lateral side 23b, the plurality of latches 40a-40c disposed adjacent to the opposite fastening lateral side 23b can be connected to each other with a connection rod 46 passing through the plurality of communication openings 444. In this way, when the crossbar 51a of the link module 50 drives the handle 44 of the latch 40a, the handles 44 of the latch 40b and the latch 40c connected through the connection rod 46 are also driven synchronously. Thereby, the link module 50 can drive the handles 44 of the plurality of latches 40a-40e to perform synchronous operations.

In the embodiment, the plurality of connection ends 443 of the plurality of handles 44 of the plurality of latches 40a-40e are slidably connected to the corresponding ones of the plurality of crossbars 51a-51c in the aforementioned manner. Notably, the plurality of latches 40a-40e and the link module 50 are constructed in the space above the top surface 21 of the upper cover 20, and the plurality of housing bases 41, the plurality of handles 44 of the latches 40a-40e and the link module 50 have a vertical projection ranged with a vertical projection of the upper cover 20. This design has advantage of saving the assembling and operating space of the immersion cooling system 1. When the link module 50 is operated to move downward and attach to the top surface 21 of the upper cover 20, the plurality of crossbars 51a-51c drive the plurality of handles 44 to simultaneously drive the plurality of sliding rods 42 to slide horizontally toward the corresponding plurality of fixing components 30a-30e. For example, the sliding rods 42 of the latches 40a-40c protrude horizontally from the fastening lateral side 23b along the reverse X axial direction, the sliding rod 42 of the latch 40d protrudes horizontally from the fastening lateral side 23c along the Y axial direction, and the sliding rod 42 of the latch 40e protrudes horizontally from the fastening lateral side 23d along the reverse Y axial direction. At this time, the plurality of scroll-wheels 43 of the plurality of latches 40a-40e interfere with the plurality of limiting surfaces 31 of the corresponding plurality of fixing components 30a-30e in a vertical viewing direction (i.e., the Z axial direction). The plurality of scroll-wheels 43 of the plurality of latches 40a-40e roll along and abut against the limiting surfaces 31 of the plurality of fixing components 30a-30e corresponding thereto, so that the bottom surface 22 of the upper cover 20 closely fits the opening 11 of the box 10 to form the airtight space. On the contrary, when the user operates the link module 50 to be separated from the top surface 21 of the upper cover 20 and move upwards, the plurality of crossbars 51a-51c drive the plurality of handles 44 to simultaneously drive the plurality of sliding rods 42 to slide horizontally away from the corresponding plurality of fixing components 30a-30e in one operation, and the plurality of scroll-wheels 43 of the plurality of latches 40a-40e move away from the limiting surfaces 31 of the plurality of fixing components 30a-30e corresponding thereto. In that, the plurality of latches 40a-40e and the link module 50 have the vertical projection to be restored and ranged within the vertical projection of the upper cover 20. Since the plurality of latches 40a-40e and the corresponding plurality of fixing components 30a-30e do not interfere with each other, it allows to separate the bottom surface 22 of the upper cover 20 from the opening 11, so that the user can perform the replacement or maintenance operations to replace or maintain the electronic components or the coolant.

Notably, the plurality of fixing components 30a-30e and the plurality of latches 40a-40e are cooperated in pairs, and the arrangement and the number of the pairs disposed adjacent to the three fastening lateral sides 23b-23d are adjustable according to the practical requirements. Similarly, the link relationship among the plurality of latches 40a-40e and the plurality of crossbars 51a-51c of the link module 50 is adjustable according to the practical requirements. In an embodiment, the latch 40b and the latch 40c are omitted, so that the number of the plurality of latches 40a, 40d, 40e disposed adjacent to each of the three fastening lateral sides 23b-23d is equal to each other. That is, the plurality of latches 40a, 40d, 40e are disposed adjacent to the middle sections of the three fastening lateral sides 23b-23d, respectively, and each of the latches 40a, 40d, 40e is slidably connected to the oval slots 52 of the corresponding crossbars 51a-51c through the link elements 45, respectively. In other embodiment, the number of the plurality of latches disposed adjacent to each of the three fastening lateral sides 23b-23d is the same and equal to N, N is an integer, and N>1. The N latches are slidably connected to the N crossbars. Certainly, the present disclosure is not limited thereto. Moreover, in an embodiment, one of the three fastening lateral sides 23b-23d is an opposite fastening lateral side 23b disposed opposite to the connection lateral side 23a, the number of the plurality of latches disposed adjacent to the opposite fastening lateral side 23b is equal to 3, but different from the numbers of latches disposed on the other fastening lateral sides 23c, 23d. In other embodiment, the number of the plurality of latches disposed adjacent to the opposite fastening lateral side 23b is equal to 2M+1, M is an integer, and M≥1. Certainly, the numbers and the arrangements of the fixing components 30a-30e, the latches 40a-40e and the crossbars 51a-51c are adjustable according to the practical requirements, and the present disclosure is not limited thereto.

In the embodiment, the link module 50 further includes a holding handle 53 arranged at a place where the plurality of crossbars 51a-51c are converged. It facilitates the user to exert force to move the link module 50 up and down, and perform the opening and closing operations through the plurality of crossbars 51a-51c synchronously driving the plurality of latches 40a-40e. Moreover, in the embodiment, the upper cover 20 further includes at least one carrying handle 24 disposed adjacent to one of the three fastening lateral sides 23b-23d that is relatively far away from the connection lateral side 23a. That is, the at least one carrying handle 24 is disposed adjacent to the opposite fastening lateral side 23b, for the user to further open the upper cover 20 when the plurality of latches 40a-40e are in the unlocked state, as shown in FIG. 5. Moreover, in the embodiment, the upper cover 20 includes two carrying handles 24 symmetrically disposed on two opposite laterals of the middle section of the opposite fastening lateral side 23b. In other embodiments, the arrangements and the numbers of the holding handle 53 of the link module 50 or the carrying handles 24 of the upper covers 20 are adjustable according to the practical requirements, and the present disclosure is not limited thereto. In the embodiment, the upper cover 20 further includes a sealing strip 25 disposed on the bottom surface 22 and spatially corresponding to the outer perimeter of the opening 11 of the box 10. When the plurality of latches 40a-40e interfere with the corresponding ones of the plurality of fixing components 30a-30e and push the upper cover 20 downwardly, the sealing strip 25 between the upper cover 20 and the box 10 is further compressed by the upper cover 20, so as to enhance the effect of sealing the opening 11. Certainly, the present disclosure is not limited thereto.

Figure 10:
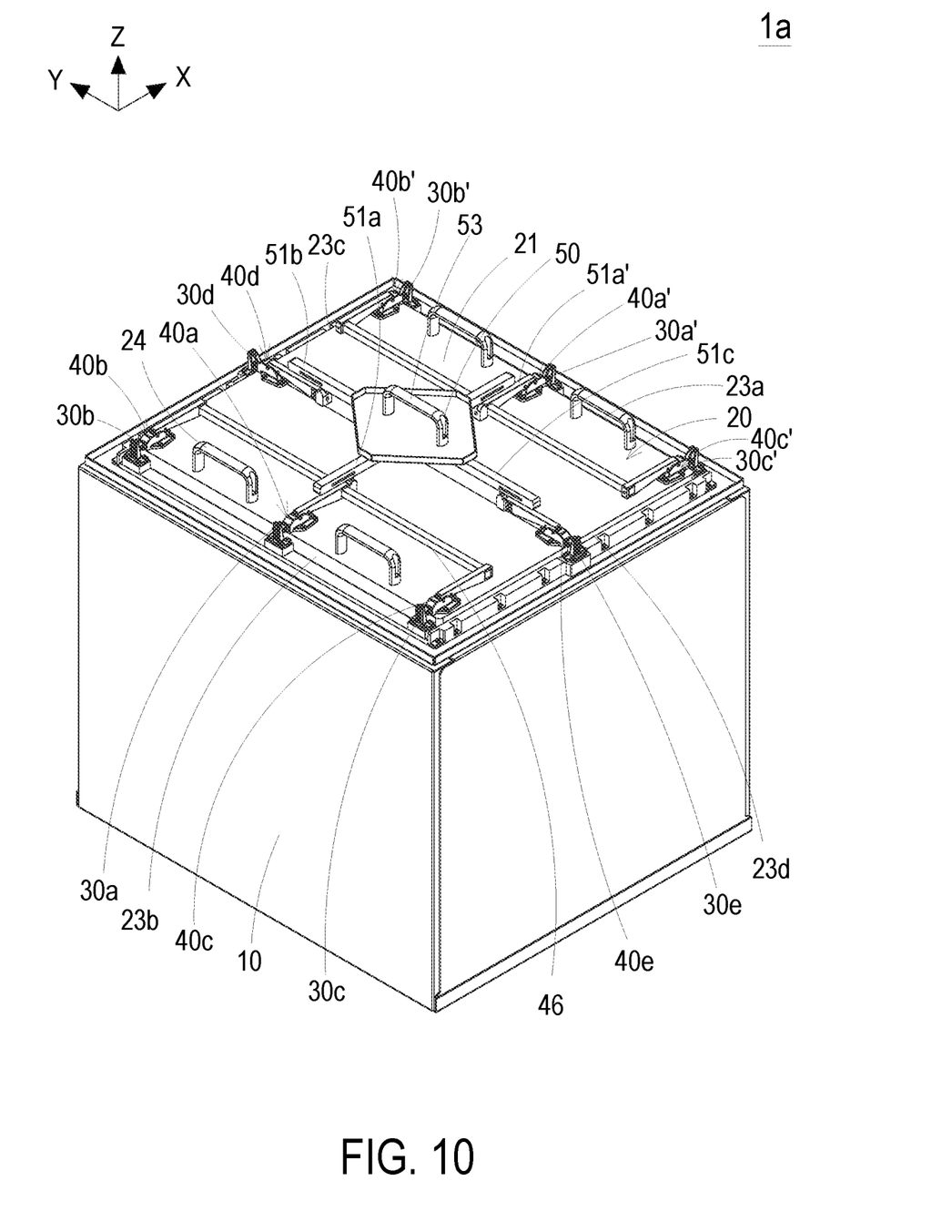
FIG. 10 is a perspective structural view illustrating an immersion cooling system with an airtight link latch cover structure operated in the closed state according to a second embodiment of the present disclosure.

FIG. 10 is a perspective structural view illustrating an immersion cooling system with an airtight link latch cover structure operated in the closed state according to a second embodiment of the present disclosure. In the embodiment, the structures, elements and functions of the immersion cooling system 1a with the airtight link latch cover structure are similar to those of the immersion cooling system 1 with the airtight link latch cover structure of FIG. 1 to FIG. 9, and are not redundantly described herein. In the embodiment, the immersion cooling system 1a with the airtight link latch cover structure further includes a plurality of latches 40a-40e, 40a'-40c' and a plurality of fixing components 30a-30e, 30a'-30c', which are cooperated in pairs and disposed adjacent to the three fastening lateral sides 23b-23d and the connection lateral side 23a, respectively. Different form the pivot connection implemented through the pivot elements 13 between the connection lateral side 23a of the upper cover 20 and the box 10 in the first embodiment, in the embodiment, the plurality of latches 40a'-40c' and the plurality of fixing components 30a'-30c' cooperated in pairs are disposed adjacent to the connection lateral side 23a to implement the connection between the connection lateral side 23a of the upper cover 20 and the box 10. Preferably but not exclusively, the pairing of the latches 40a'-40c' and the fixing components 30a'-30c' is the same as the pairing of the latches 40a-40c and the fixing components 30a-30c. Moreover, the slidable connection between the latch 40a'-40c' and the crossbar 51a' corresponding thereto is also the same as the slidable connection between the latches 40a-40c and the crossbars 51a-51c corresponding thereto, and not redundantly described herein. Notably, when the three fastening lateral sides 23b-23d and the connection lateral side 23a of the upper cover 20 are connected to the box 10 through the latches 40a-40e, 40a'-40c' and the fixing components 30a-30e, 30a'-30c' cooperated in pairs to realize the locking function, the operation of unlocking the upper cover 20 and detaching the upper cover 20 from the opening 11 can be completed in a single direction (i.e., the Z axial direction). Certainly, the arrangements and the numbers of the latches 40a-40e, 40a'-40c', the fixing components 30a-30e, 30a'-30c' and the crossbars 51a-51c, 51a' are not limited to the illustrated embodiments, and not redundantly described hereafter.

In summary, the present disclosure provides an immersion cooling system with an airtight link latch cover structure having handles combined with a link module to synchronously drive a plurality of latches in an open operation or a close operation, so that the convenience of operation is increased, and the airtight effect is achieved when the upper cover is locked. Consequently, the leakage of evaporated gas is avoided, the loss of dielectric liquid is decreased, and the purpose of cost saving is achieved. In the present disclosure, the airtight link latch cover structure is disposed over an upper space of the immersion cooling system by combining a link module with a plurality of latches. The plurality of latches disposed on the upper cover are arranged adjacent to the at least three fastening lateral sides of the upper cover, and spatially corresponding to a plurality fixing components disposed adjacent to an outer perimeter of the opening of the box, so that the plurality of latches are cooperated with the plurality of fixing components in pairs. The link module allows to synchronously drive each handle of the latches disposed adjacent to the different fastening lateral sides of the same fastening lateral side through the link elements, and the user only needs to perform the operations of sealing, unlocking and opening the upper cover in the space above the upper cover. When the user presses down the link module to synchronously drive the plurality of handles of the plurality of latches, only the scroll-wheels pivotally connected to the front ends of the sliding rods of the plurality of latches exceed the vertical projection range of the upper cover and interfere with the corresponding ones of the plurality of fixing components. In detail, when the scroll-wheels are driven by the sliding rods to move towards the corresponding ones of the fixing components, each scroll-wheel rolling along the corresponding limiting surface of the fixing components is pressed against the corresponding limiting surface to push the upper cover downwardly, so that the plurality of latches are pushed downwardly at the same time, and the sealing strip between the upper cover and the box is compressed to achieve the effect of sealing the opening. Consequently, it completely prevents the dielectric liquid in the box from evaporating and leaking through the opening, the loss of the dielectric liquid is decreased, and the purpose of cost saving is achieved. On the other hand, when the user pulls up the link module to synchronously drive the plurality of handles of the plurality of latches, each scroll-wheel of the plurality of latches rolls back into the respective housing base along the direction away from the corresponding limiting surface, and does not interfere with the corresponding fixing component. The link module and the plurality of latches are all within the vertical projection range of the upper cover, and it allows the upper cover to be separated from the opening of the box for the user to perform the maintenance work or replace electronic components in the box. The opening and closing operations are simplified effectively, and the convenience of operation is improved. In addition, the plurality of latches and the plurality of fixing components cooperated in pairs are not limited to being disposed adjacent to the three fastening lateral sides of the upper cover. The hinge connection between the connecting side of the upper cover and the box can also be replaced by the latching method of the latch and the fixing component in pair, so that the operation of unlocking and opening the upper cover can be realized in a single direction (up or down). In other words, when the upper cover seals the opening of the box in the immersion cooling system through the airtight link latch cover structure, the number and the arrangement of the plurality of latches are adjustable according to the airtight requirements, so as to increase the convenience of operation and maintain the airtight effect when the upper cover is locked. Consequently, the leakage of evaporated gas is avoided, the loss of dielectric liquid is decreased, and the purpose of cost saving is achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An immersion cooling system with an airtight link latch cover structure, comprising:
    a box comprising an opening facing upwards;
    an upper cover comprising a connection lateral side, three fastening lateral sides, a top surface and a bottom surface, wherein the connection lateral side and the three fastening lateral sides are connected between the top surface and the bottom surface, the connection lateral side is connected to an edge of the opening, and the bottom surface covers the opening to form an airtight space;
    a plurality of fixing components spatially corresponding to the three fastening lateral sides and disposed adjacent to an outer perimeter of the opening, wherein each of the plurality of fixing components comprises a limiting surface, and the limiting surfaces have a height greater than that of the top surface when the bottom surface covers the opening;
    a plurality of latches spatially corresponding to the plurality of fixing components and disposed on the top surface of the upper cover, wherein each of the plurality of latches comprises:
        a housing base disposed on the upper cover, facing a corresponding one of the plurality of fixing components, and arranged adjacent to one of the three fastening lateral sides;
        a sliding rod slidably disposed on the housing base, wherein a front end of the sliding rod faces the corresponding one of the plurality of fixing components;
        a scroll-wheel pivotally connected to the front end of the sliding rod; and
        a handle pivotally connected to the housing base and comprising an end abutting against the sliding rod, wherein another end of the handle is operated to drive the sliding rod to slide in a horizontal direction; and
    a link module spatially arranged above the top surface of the upper cover, and comprising a plurality of crossbars corresponding to the plurality of handles of the plurality of latches, wherein the plurality of handles comprise a plurality of connection ends slidably connected to corresponding ones of the plurality of crossbars, respectively;
    wherein when the link module is moved down toward the top surface of the upper cover, the plurality of crossbars drive the plurality of handles to simultaneously drive the plurality of sliding rods to slide horizontally toward the corresponding plurality of fixing components, and the plurality of scroll-wheels roll along and abut against the limiting surfaces of the plurality of fixing components corresponding thereto, so that the bottom surface of the upper cover closely fits the opening to form the airtight space; or
    when the link module is moved up away from the top surface of the upper cover, the plurality of crossbars drive the plurality of handles to simultaneously drive the plurality of sliding rods to slide horizontally away from the corresponding plurality of fixing components, and the plurality of scroll-wheels move away from the limiting surfaces of the plurality of fixing components corresponding thereto, so that the bottom surface of the upper cover allows being separated from the opening.

2. The immersion cooling system with the airtight link latch cover structure according to claim 1, wherein the sliding rod comprises a first abutting element and a second abutting element accommodated within the housing base, wherein the first abutting element is located between the front end and the second abutting element.

3. The immersion cooling system with the airtight link latch cover structure according to claim 2, wherein the handle comprises an acting end, the acting end is accommodated within the housing base and located between the first abutting element and the second abutting element, and the connection end is located outside the housing base.

4. The immersion cooling system with the airtight link latch cover structure according to claim 3, wherein the first abutting element is a transverse cylinder perpendicular to the handle, and the acting end of the handle comprises an arc surface correspondingly abutting against the first abutting element.

5. The immersion cooling system with the airtight link latch cover structure according to claim 3, wherein each of the plurality of latches further comprises a spring sleeved between the second abutting element of the sliding rod and the housing base corresponding thereto.

6. The immersion cooling system with the airtight link latch cover structure according to claim 1, wherein the number of the plurality of latches disposed adjacent to each of the three fastening lateral sides is N, N is an integer, and N≥1.

7. The immersion cooling system with the airtight link latch cover structure according to claim 6, wherein one of the three fastening lateral sides is an opposite fastening lateral side disposed opposite to the connection lateral side, the number of the plurality of latches disposed adjacent to the opposite fastening lateral side is 2M+1, M is an integer, and M≥1.

8. The immersion cooling system with the airtight link latch cover structure according to claim 7, wherein the plurality of latches and the plurality of fixing components cooperated in pairs have at least one pair thereof disposed adjacent to a middle section of the opposite fastening lateral side, and have at least two others pairs thereof disposed adjacent to two ends of the opposite fastening lateral side, respectively.

9. The immersion cooling system with the airtight link latch cover structure according to claim 8, wherein each of the plurality of handles of the plurality of latches has a communication opening disposed adjacent to the connection end thereof, wherein the plurality of latches disposed adjacent to the opposite fastening lateral side are connected to each other with a connection rod passing through the plurality of communication openings.

10. The immersion cooling system with the airtight link latch cover structure according to claim 9, wherein the latch disposed adjacent to the middle section of the opposite fastening lateral side is slidably connected to an oval slot of the corresponding crossbar through a link element.

11. The immersion cooling system with the airtight link latch cover structure according to claim 1, wherein at least three of the plurality of latches are disposed adjacent to three middle sections of the three fastening lateral sides, respectively, and each of the latches is slidably connected to an oval slot of the corresponding crossbar through a link element.

12. The immersion cooling system with the airtight link latch cover structure according to claim 11, wherein the link module includes three crossbars spatially corresponding to the middle sections of the three fastening lateral sides, the three crossbars are arranged in a T shape.

13. The immersion cooling system with the airtight link latch cover structure according to claim 12, wherein the link module further comprises a holding handle arranged at a place where the plurality of crossbars are converged.

14. The immersion cooling system with the airtight link latch cover structure according to claim 1, wherein the plurality of housing bases and the plurality of handles of the plurality of latches and the link module have a vertical projection ranged within a vertical projection of the upper cover.

15. The immersion cooling system with the airtight link latch cover structure according to claim 1, wherein when the link module is moved down toward the top surface of the upper cover, the plurality of scroll-wheels of the plurality of latches interfere with the plurality of limiting surfaces of the plurality of fixing components corresponding thereto in a vertical viewing direction.

16. The immersion cooling system with the airtight link latch cover structure according to claim 1, wherein each of the plurality crossbars of the link module comprises an oval slot connected to the connection end of the handle corresponding thereto through a link element.

17. The immersion cooling system with the airtight link latch cover structure according to claim 1, wherein the connection lateral side of the upper cover is connected to the box through a pivot element.

18. The immersion cooling system with the airtight link latch cover structure according to claim 17, wherein the upper cover comprises at least one carrying handle disposed adjacent to one of the three fastening lateral sides that is relatively far away from the connection lateral side.

19. The immersion cooling system with the airtight link latch cover structure according to claim 1, wherein the plurality of fixing components are spatially corresponding to the connection lateral side and three fastening lateral sides of the upper cover and disposed adjacent to the outer perimeter of the opening, wherein the plurality of latches and the plurality of fixing components cooperated in pairs have at least one pair thereof disposed adjacent to the connection lateral side and configured to connect the connection lateral side of the upper cover and the box.

20. The immersion cooling system with the airtight link latch cover structure according to claim 1, wherein the upper cover further comprises a sealing strip disposed on the bottom surface and spatially corresponding to the outer perimeter of the opening of the box.

* * * * *